(12) United States Patent
Watanabe et al.

(10) Patent No.: US 7,508,129 B2
(45) Date of Patent: Mar. 24, 2009

(54) SURFACE MOUNT LED

(75) Inventors: Seishi Watanabe, Tokyo (JP); Yoshihiro Ogawa, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 436 days.

(21) Appl. No.: 11/275,352

(22) Filed: Dec. 28, 2005

(65) Prior Publication Data

US 2006/0151799 A1    Jul. 13, 2006

(30) Foreign Application Priority Data

Jan. 7, 2005    (JP)    ............................. 2005-002705

(51) Int. Cl.
*H01J 1/62*    (2006.01)
(52) U.S. Cl. ...................... 313/506; 313/498
(58) Field of Classification Search ................. 313/506, 313/498
See application file for complete search history.

(56) References Cited

U.S. PATENT DOCUMENTS

| 6,066,861 | A | 5/2000 | Hohn et al. |
|---|---|---|---|
| 6,245,259 | B1 | 6/2001 | Hohn et al. |
| 6,277,301 | B1 | 8/2001 | Hohn et al. |
| 6,576,930 | B2 | 6/2003 | Reeh et al. |
| 6,592,780 | B2 | 7/2003 | Hohn et al. |
| 6,613,247 | B1 | 9/2003 | Hohn et al. |
| 6,669,866 | B1 | 12/2003 | Kummer et al. |
| 6,774,401 | B2 | 8/2004 | Nakada et al. |
| 6,809,342 | B2 | 10/2004 | Harada |
| 6,812,500 | B2 | 11/2004 | Reeh et al. |

FOREIGN PATENT DOCUMENTS

| JP | 07202271 | 8/1995 |
|---|---|---|
| JP | 10190065 | 7/1998 |
| JP | 2001127346 | 5/2001 |
| JP | 2001196639 | 7/2001 |
| JP | 2001210872 | 8/2001 |
| JP | 2001345483 | 12/2001 |
| JP | 2004056075 | 2/2004 |

OTHER PUBLICATIONS

Translation of Toshiyuki et al, JP 07-202271.*

* cited by examiner

*Primary Examiner*—Vip Patel
(74) *Attorney, Agent, or Firm*—Cermak Kenealy Vaidya & Nakajima LLP

(57) ABSTRACT

In a surface mount LED, circuit patterns can be formed on selective portions of the bottom and inner circumferential surfaces of a recess in a substrate in which an LED chip is mounted. A sealant material composed of a light transmissive resin can be applied to cover the LED chip for sealing. An intimate contact interface is formed between the material of the insulator/substrate which is exposed at a portion with no circuit pattern formed thereon, and the light transmissive resin. The strength of intimate contact can be enhanced to prevent the circuit patterns and conductive adhesive from peeling off at an interface therebetween.

21 Claims, 3 Drawing Sheets

SURFACE MOUNT LED

This application claims the priority benefit under 35 U.S.C. § 119 of Japanese Patent Application No. 2005-002705 filed on Jan. 7, 2005, the disclosure of which is hereby incorporated in its entirety by reference.

BACKGROUND OF THE INVENTION

1. Field of the Invention

The invention relates to a surface-mount light-emitting diode (LED). More particularly, the invention relates to a surface-mounted LED including an LED chip mounted in a recess provided in a substrate, in which a sealant resin is applied to seal the LED chip.

2. Description of the Related Art

A conventional surface-mounted LED may have the structure shown in FIGS. 8 and 9. FIG. 8 is a top view and FIG. 9 is a cross-sectional view taken along line A-A in FIG. 8. It includes a pair of circuit patterns 51a, 51b formed in the upper surface of an insulator 50 at both opposite ends. The circuit patterns 51a, 51b extend from edges of the insulator 50 to the lower surface around sides of the insulator 50. A recess 52 is provided almost at the center in the upper surface of the insulator 50. A circuit pattern is formed over the entire bottom 53 and the entire inner circumferential surface 54 in the recess 52. This circuit pattern is connected as an extension from the one circuit pattern 51a of the pair of circuit patterns 51a, 51b formed in the upper surface of the insulator 50. The other circuit pattern 51b extends toward the center of the insulator 50.

An LED chip 56 is mounted on the bottom 53 in the recess 52 via a conductive adhesive 55. In this case, the lower electrode of the LED chip 56 is connected to the circuit pattern 51a formed on the bottom 53 in the recess 52 for achievement of the electrical conduction therebetween. The upper electrode of the LED chip 56 is connected via a bonding wire 57 to the circuit pattern 51b that extends substantially toward the center of the substrate for achievement of the electrical conduction therebetween.

A light transmissive resin 58 is applied to cover the LED chip 56 and the bonding wire 57 for sealing and protecting the LED chip 56 from the external environmental elements such as humidity, dirt, and gases. In addition, it protects the bonding wire 57 from mechanical stresses such as vibrations and impacts (see, for example, Patent Publication 1: JP-A 7/202271 along with its associated English Abstract, machine translation, and drawings, which are submitted herewith in an Information Disclosure Statement and are hereby incorporated in their entireties by reference).

Surface-mounted LEDs are often employed together with other surface-mounted electronic components and are generally surface-mounted on a component-mounting board in an electronic instrument through a solder reflow furnace. In this case, the surface-mounted LED is extremely small and, accordingly, the temperature of the whole LED may elevate almost up to the heating temperature of the solder reflow furnace.

At the elevated temperature, the light transmissive resin for use in sealing the LED chip and the bonding wire have a difference in thermal expansion coefficient as compared to the circuit pattern formed on the bottom in the recess. This difference and other factors may cause a stress that results in peel at a contact interface between the circuit pattern and the resin. Then, the light transmissive resin exerts a force on the conductive adhesive and the LED chip to lift them above the circuit pattern. In this case, the light transmissive resin may peel off the circuit pattern, possibly resulting in an electrical property failure.

Even after the surface-mounted LED is mounted on the component-mounting board, the repetition of switching the LED on/off can cause repeated thermal expansion and contraction of the light transmissive resin. In addition, the stress at that time may exert the same action as described above and possibly result in an electrical property failure.

SUMMARY OF THE INVENTION

The invention has been made in consideration of the above (and other) problems, considerations and features of the related art and conventional practices. In accordance with an aspect of the invention, an LED device can be made that suppresses the interface peel between a circuit pattern and a conductive adhesive applied for electrically connecting the circuit pattern with an LED chip. Thus, among other aspects, a reliable surface-mounted LED can be provided that causes little or no electrical property failure in high-temperature mounting environments and in practical use.

In view of the above subject matter, and in accordance with another aspect of the invention, a surface-mount LED can include: a plurality of separate circuit patterns formed on a surface of an insulator contained in a substrate; an LED chip mounted on the bottom in a recess provided substantially at the center of the insulator; and a sealant resin applied to cover the LED for sealing, wherein the bottom in the recess has portions with no circuit pattern formed therein, and wherein the inner circumferential surface of the recess has circuit patterns formed entirely therein.

A surface-mount LED according to another aspect of the invention can include a plurality of separate circuit patterns formed on a surface of an insulator contained in a substrate; an LED chip mounted on the bottom in a recess provided substantially at the center of the insulator; and a sealant resin applied to cover the LED for sealing, wherein the bottom in the recess has portions with no circuit pattern formed therein, and wherein the inner circumferential surface of the recess at least partly has portions with no circuit pattern formed therein.

The portions with no circuit pattern formed therein on the bottom in the recess can be arranged on a location for mounting the LED chip thereon and on locations that are substantially symmetrical about the location for mounting the LED chip thereon.

The surfaces of the circuit patterns, formed on the bottom and the inner circumferential surface of the recess, and the surface of the insulator, with no circuit pattern formed therein and thus exposed, can adjoin the sealant resin.

The sealant resin can be selected from the group consisting of a light transmissive resin, a light transmissive resin mixed with a diffuser, a light transmissive resin mixed with at least one wavelength conversion material (e.g., fluorescent substance), and a light transmissive resin mixed with a diffuser and at least one wavelength conversion material (e.g., fluorescent substance).

In another aspect of the invention, the recess for mounting the LED chip therein can be provided in the substrate contained in the surface-mounted LED. In addition, a portion with no circuit pattern formed therein can be partly formed on the bottom among the bottom and the inner circumferential surface of the recess to expose the insulator, or the material of the substrate. Thus, the sealant resin for sealing the LED chip can make intimate contact with the insulator exposed at the recess to form an interface therebetween.

In accordance with another aspect of the invention, a surface-mount LED can include: an insulator having a surface and a recess, the recess having a bottom portion and a circumferential portion formed adjacent the bottom portion; a plurality of separate circuit patterns adjacent the surface of the insulator; an LED chip assembly located adjacent the bottom portion of the recess provided in the insulator; and a sealant resin located adjacent the LED for sealing, wherein at least one of the circuit patterns is configured to extend continuously across the circumferential portion of the recess and to provide an open area adjacent the bottom portion of the recess.

In accordance with another aspect of the invention, a surface-mount LED can include: an insulator having a surface and a recess, the recess having a bottom portion and a circumferential portion formed adjacent the bottom portion; a plurality of separate circuit patterns adjacent the surface of the insulator; an LED chip assembly located adjacent the bottom portion of the recess provided in the insulator; and a sealant resin located adjacent the LED for sealing, wherein at least one of the circuit patterns is configured to provide an open area located at least partially between the LED chip assembly and the bottom portion of the recess, and at least one of the circuit patterns is configured to provide another open area at the circumferential portion of the recess.

As a result, compared to the contact interface between the sealant resin and the circuit pattern, the intimate contact interface between the sealant resin and the exposed insulator has a stronger intimate contact force. Therefore, it is possible to suppress peel in high-temperature mounting environments and in practical use even when a thermal stress acts on the interface between the sealant resin and the insulator.

Accordingly, it is possible to suppress interface peel between the circuit pattern partly formed on the bottom in the recess and the conductive adhesive applied for electrically connecting the circuit pattern with the LED chip. Thus, a reliable surface-mounted LED that causes little or no electrical property failure can be provided.

DETAILED DESCRIPTION OF EXEMPLARY EMBODIMENTS

Figure 1:
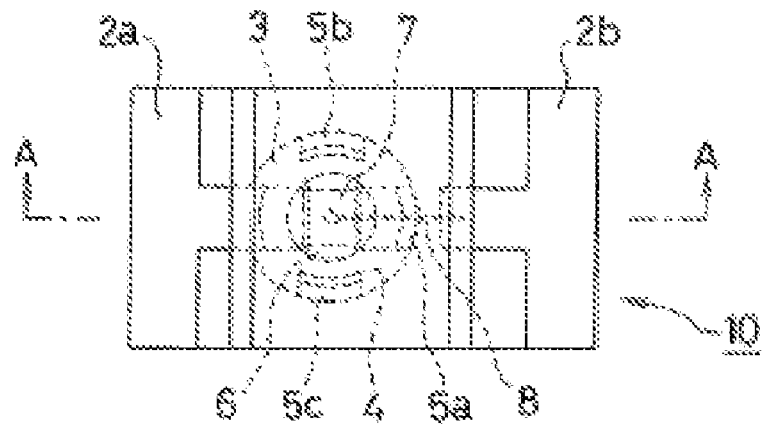
FIG. 1 is a top view illustrative of an embodiment of a surface-mount LED made in accordance with principles of the invention.

Exemplary embodiments of the invention will now be described with reference to FIGS. 1-7 in detail (using the same reference numerals to denote the same or similar parts). The embodiments described below are examples of the invention and include various technical features. The scope of the invention is not limited to these embodiments.

Figure 2:
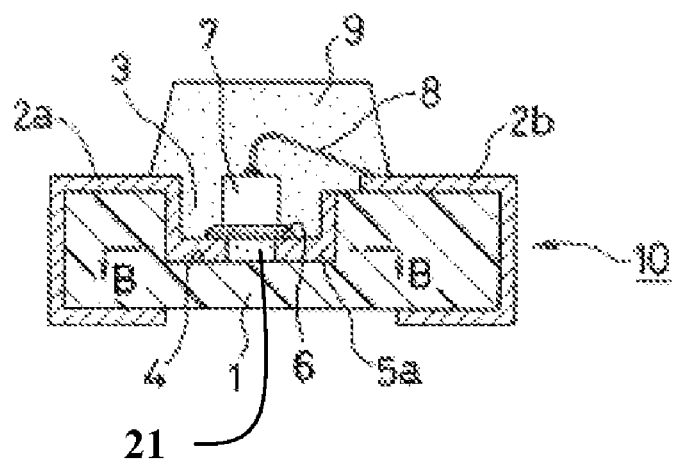
FIG. 2 is a cross-sectional view taken along line A-A in FIG. 1.

FIG. 1 is a top view illustrative of an embodiment of a surface-mount LED made in accordance with principles of the invention, and FIG. 2 is a cross-sectional view taken along line A-A in FIG. 1. An insulator 1 has an upper surface with opposite ends, on which a pair of circuit patterns 2a, 2b are formed. The circuit patterns 2a, 2b can extend from edges, around sides, to the lower surface of the insulator 1.

A recess 3 can be provided at the upper surface of the insulator 1. The recess can be provided at the approximate center of and in the upper surface of the insulator 1. The circuit pattern 2a can extend around part of the inner circumferential surface of the recess 3 to part of the bottom 4. A circuit pattern 5a can be formed at a location opposing the circuit pattern 2a and can extend from part of the inner circumferential surface of the recess 3 to part of the bottom 4.

In a direction almost perpendicular to the direction of connection between the circuit pattern 2a and the circuit pattern 5a, and formed on parts of the inner circumferential surface of the recess 3, a pair of circuit patterns 5b, 5c can be formed. The patterns 5b, 5c extend from part of the inner circumferential surface of the recess 3 to part of the bottom 4 and oppose each other. In this example, the patterns 2a and 5a extend closer to the center of the recess than do the patterns 5b, 5c.

An LED chip 7 can be adhered via a conductive adhesive 6 on the circuit patterns 2a and 5a which extend to parts of the bottom 4 in the recess 3 provided in the insulator 1. Thus, electric conduction is achieved between the lower electrode of the LED chip 7 and the circuit patterns 2a, 5a. On the other hand, the upper electrode of the LED chip 7 can be connected via a bonding wire 8 to the circuit pattern 2b. Thus, the electric conduction is achieved between the upper electrode of the LED chip 7 and the circuit pattern 2b. An LED chip assembly that includes a conductive adhesive 6 and LED 7 can be connected to the circuit pattern via the conductive adhesive 6. At least one of the circuit patterns can be configured such that an open area 21 is formed between the LED chip 7 and/or conductive adhesive 6 and a bottom portion of the recess 3. The open area 21 can be formed as one contiguous area or several smaller distinct areas, for example. The open area 21 can be considered those portions of the surface mount LED at which no circuit pattern exists and that is located adjacent the bottom portion of the recess as well as along the circumferential portion of the recess.

A light transmissive resin 9 can be applied to cover the LED chip 7 and the bonding wire 8 for sealing them to protect the LED chip 7 from the external environmental elements, such as humidity, dirt, and gases. In addition, the resin can protect the bonding wire 8 from mechanical stresses such as vibrations and impacts.

Figure 3:
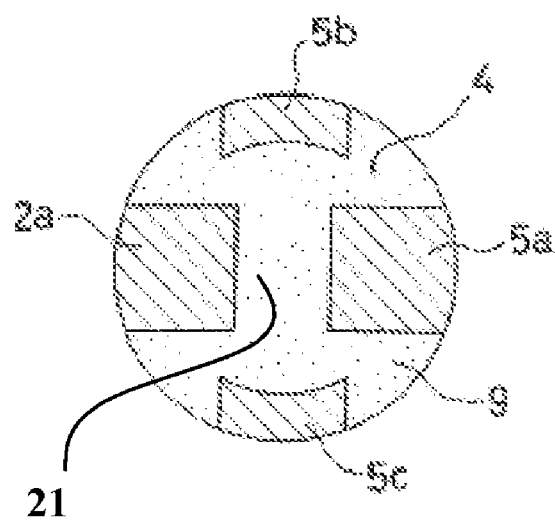
FIG. 3 is a cross-sectional view taken along line B-B in FIG. 2.

An arrangement of the circuit patterns on the bottom 4 in the recess 3 is shown in FIG. 3 as a cross-sectional view taken along line B-B in FIG. 2. The circuit patterns can be composed of a layer of conductive material such as Au, Al formed over the insulator located on the bottom portion of the recess. Undesired portions can be removed by a process of etching to leave required portions or circuit patterns 2a, 5a, 5b, and 5c and expose the recess bottom 4 composed of the insulator at open areas 21 from which the circuit patterns are removed.

At the central portion surrounded by the separate circuit patterns 2a, 5a, 5b, and 5c, the conductive adhesive 6 can be applied, and the LED chip 7 arranged thereon. In this case, the conductive adhesive 6 is applied in such a manner that it contacts with the circuit patterns 2a and 5a but not with the circuit patterns 5b and 5c. The conductive adhesive can have a high viscosity, which causes poor fluidization at the time of adhesion. Accordingly, the conductive adhesive can be substantially prevented from making contact with the exposed portions of the insulator other than the portions in contact with the circuit patterns. In other words, a cavity is formed in a portion below the conductive adhesive and above the exposed portion of the insulator. In another example, the circuit patterns 5b and 5c can be brought into conductive contact with the LED chip via the conductive adhesive. This is also contained in the embodiment of the invention.

The sealant resin 9 can be injected into the recess 3 after the LED chip 7 is mounted in the recess. Then, the insulator-exposed bottom 4 in the recess 3, including the portion below the LED chip 7, is brought into intimate contact with the sealant resin 9 to form an intimate contact interface therebetween.

The sealant resin has an intimate contact force that acts stronger on the insulator (composed of a resin or the like) than on the circuit pattern (composed of conductive material). Therefore, even when a thermal stress is applied to the sealant resin in high-temperature mounting environments and in practical use, a peel suppressing action is more effective when the insulator is exposed than when the LED chip-mounted recess bottom is covered entirely (or substantially entirely) with the circuit pattern.

As a result, the sealant resin does not exert any (or substantially any) force on the conductive adhesive and the LED chip, which force would otherwise lift them above the circuit pattern. Accordingly, the conductive adhesive applied to the circuit pattern can be prevented from peeling off the circuit pattern. Thus, it is possible to realize a reliable surface-mounted LED that causes little or no electrical property failure at the time of mounting and in long term use.

The portions for exposing the insulator are desirably arranged at locations that are symmetrical about the LED chip and located at the approximate center of the recess. The portions for exposing the insulator can include a portion below the LED-mounted location because the intimate contact force between the sealant resin and the insulator is prevented from having a deflected distribution at this location. This is effective to achieve more reliable peel suppression.

Figure 4:
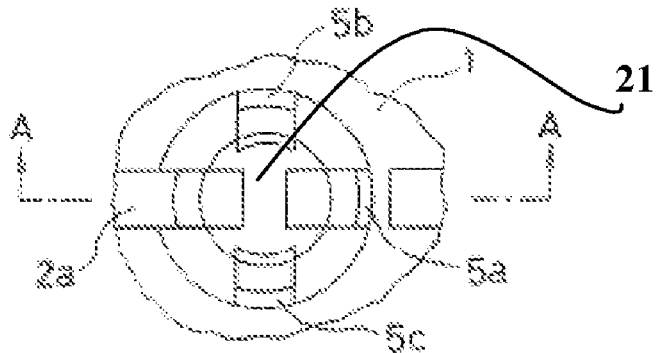
FIG. 4 is a partial top view of a recess in another embodiment of a surface-mount LED made in accordance with principles of the invention.
Figure 5:
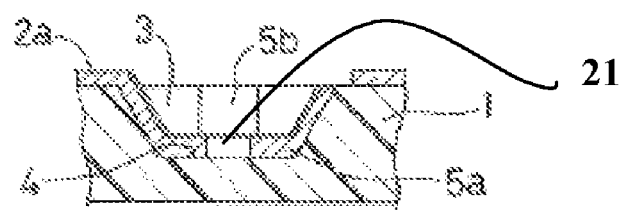
FIG. 5 is a cross-sectional view taken along line A-A in FIG. 4.

The recess may be shaped in the form of a cone having an inner circumferential surface that opens wider as it extends upward. In this case, as shown in FIG. 4 and FIG. 5, the circuit pattern 2a can be formed such that it extends around part of the inner circumferential surface in the recess 3 to part of the bottom 4. The circuit pattern 5a can also be formed at a location opposite to the circuit pattern 2a extending from part of the inner circumferential surface in the recess 3 to part of the bottom 4. In addition, the pair of circuit patterns 5b and 5c can be formed in a direction almost perpendicular to the direction of connection between the circuit patterns 2a and 5a. The patterns 5b and 5c can extend from part of the inner circumferential surface of the recess 3 to part of the bottom 4 such that they oppose each other.

Figure 6:
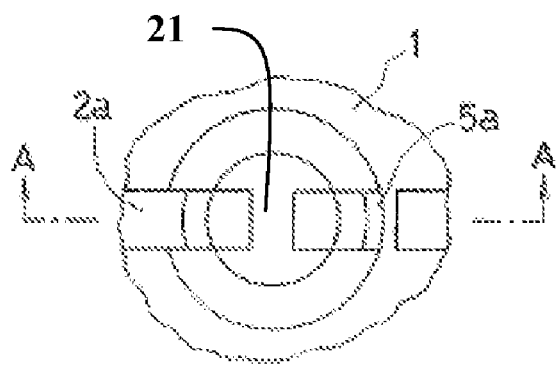
FIG. 6 is a partial top view of a recess in another embodiment of a surface-mount LED made in accordance with principles of the invention.
Figure 7:
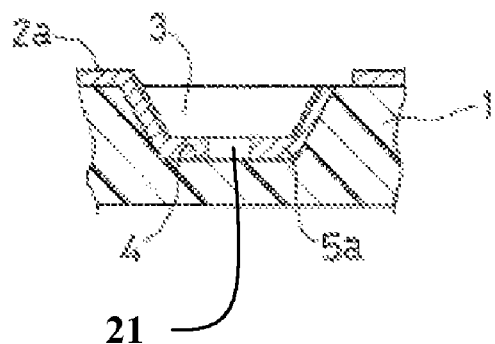
FIG. 7 is a cross-sectional view taken along line A-A in FIG. 6.
Figure 8:
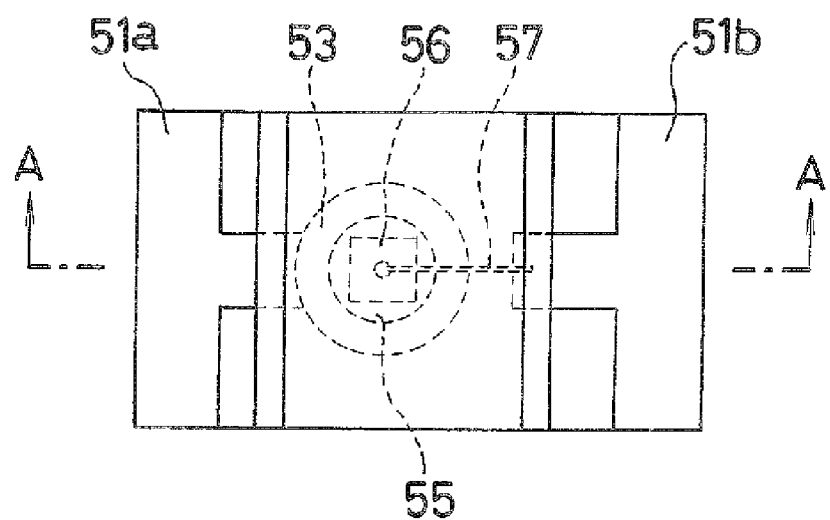
FIG. 8 is a top view illustrative of a conventional surface-mounted LED.
Figure 9:
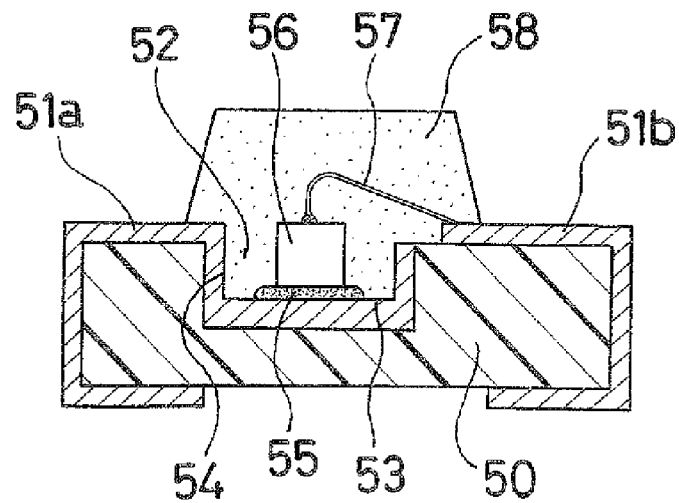
FIG. 9 is a cross-sectional view taken along line A-A in FIG. 8.

Similarly, in the conical recess, as shown in FIG. 6 and FIG. 7, the circuit pattern 2a can be formed such that it extends around part of the inner circumferential surface in the recess 3 to part of the bottom 4. The circuit pattern 5a can also be formed at a location opposite to the circuit pattern 2a and extend from part of the inner circumferential surface in the recess 3 to part of the bottom 4. In this case, the insulator 1 is exposed at other portions in the inner circumferential surface and at the bottom in the recess.

One of the purposes for shaping the LED chip-mounting recess in the form of a cone that opens wider as it extends upward is to receive and reflect light that is emitted substantially laterally from the LED chip at the inner circumferential surface. The reflected light is directed upward to externally discharge as much light as possible.

Therefore, when the insulator is composed of reflective material, the circuit pattern formed on the inner circumferential surface in the recess can be minimized to efficiently discharge light externally from the reflecting surface composed of the insulator. In this case, the intimate contact force acting between the inner circumferential surface in the recess and the insulator becomes much stronger. This is effective to powerfully prevent the sealant resin from peeling off. An extension of the circuit, for example, 2a may be provided over the entire of the inner circumferential surface in the recess.

In any case, the reflectivity of the insulator for forming the inner circumferential surface in the recess, the reflectivity of the circuit pattern, the intimate contact force acting on the sealant resin, and the reflection efficiency of light can all be considered to determine the shape of the circuit pattern formed on the inner circumferential surface in the recess. As described above, the circuit pattern may not have portions formed on the inner circumferential surface in the recess as one of the options.

The sealant material can be a light transmissive resin having a property of light transmission. Possible light transmissive resins that can be used include an epoxy resin as well as a silicone resin. In addition, a light transmissive resin that is mixed with a light diffuser to convert the light that is externally emitted from the LED chip into a diffused light can also be used. Also available for use is a light transmissive resin mixed with a wavelength converter material or fluorescent substance to convert the light emitted from the LED chip into a different tone light. Also, a light transmissive resin mixed with both a light diffuser and a fluorescent substance to exert both effects at the same time can be used.

While there has been described what are at present considered to be exemplary embodiments of the invention, it will be understood that various modifications may be made thereto, and it is intended that the appended claims cover all such modifications as fall within the true spirit and scope of the invention. All related art references described above are hereby incorporated in their entirety by references.

What is claimed is:

1. A surface-mount LED, comprising:
    an insulator having a surface and a recess, the recess having a bottom portion and a circumferential portion formed adjacent the bottom portion;
    a plurality of separate circuit patterns adjacent the surface of the insulator;
    an LED chip assembly including a top surface facing in a light emitting direction and a bottom surface opposed to the top surface and located adjacent the bottom portion of the recess provided in the insulator; and
    a sealant resin located adjacent the LED for sealing, wherein
    at least one of the circuit patterns discontinues at a location between the insulator and the bottom surface of the LED chip to provide an open area adjacent the bottom portion of the recess.

2. A surface-mount LED, comprising:
    an insulator having a surface and a recess, the recess having a bottom portion and a circumferential portion formed adjacent the bottom portion;
    a plurality of separate circuit patterns adjacent the surface of the insulator;

an LED chip assembly located adjacent the bottom portion of the recess provided in the insulator; and sealant resin located adjacent the LED for sealing, wherein at a least one of the circuit patterns discontinues to provide an open area located at least partially between the LED chip assembly and the bottom portion of the recess of the insulator, and at least one of the circuit patterns discontinues to provide another open area at the circumferential portion of the recess.

3. The surface-mount LED according to claim 1, wherein the open area adjacent the bottom portion of the recess is adjacent the LED chip and symmetrical about the LED chip.

4. The surface-mount LED according to claim 1, wherein the open area includes a portion of the sealant resin, and an outer surface of the circuit pattern, formed on the bottom and the circumferential portions of the recess, and a portion of the surface of the insulator located adjacent the open area and thus exposed, adjoin the sealant resin.

5. The surface-mount LED according to claim 1, wherein the sealant resin is selected from the group consisting of a light transmissive resin; a light transmissive resin mixed with a diffuser; a light transmissive resin mixed with at least one wavelength converting substance; and, a light transmissive resin mixed with a diffuser and at least one wavelength converting substance.

6. The surface-mount LED according to claim 2, wherein the open area adjacent the bottom portion of the recess is adjacent the LED chip and symmetrical about the LED chip.

7. The surface-mount LED according to claim 2, wherein the open area includes a portion of the sealant resin, and an outer surface of the circuit pattern, formed on the bottom and the circumferential portions of the recess, and a portion of the surface of the insulator located adjacent the open area and thus exposed, adjoin the sealant resin.

8. The surface-mount LED according to claim 3, wherein the open area includes a portion of the sealant resin, and an outer surface of the circuit pattern, formed on the bottom and the circumferential portions of the recess, and a portion of the surface of the insulator located adjacent the open area and thus exposed, adjoin the sealant resin.

9. The surface-mount LED according to claim 2, wherein the sealant resin is selected from the group consisting of: a light transmissive resin; a light transmissive resin mixed with a diffuser; a light transmissive resin mixed with at least one wavelength converting substance; and, a light transmissive resin mixed with a diffuser and at least one wavelength converting substance.

10. The surface-mount LED according to claim 3, wherein the sealant resin is selected from the group consisting of: a light transmissive resin; a light transmissive resin mixed with a diffuser; a light transmissive resin mixed with at least one wavelength converting substance; and, a light transmissive resin mixed with a diffuser and at least one wavelength converting substance.

11. The surface-mount LED according to claim 4, wherein the sealant resin is selected from the group consisting of: a light transmissive resin; a light transmissive resin mixed with a diffuser; a light transmissive resin mixed with at least one wavelength converting substance; and, a light transmissive resin mixed with a diffuser and at least one wavelength converting substance.

12. The surface-mount LED according to claim 1, wherein the recess is located substantially at a center of the insulator, and the insulator is formed from a substrate.

13. The surface-mount LED according to claim 2, wherein the recess is located substantially at a center of the insulator, and the insulator is formed from a substrate.

14. The surface-mount LED according to claim 1, wherein the LED chip assembly includes a conductive adhesive for mounting to at least one of the circuit patterns.

15. The surface-mount LED according to claim 2, wherein the LED chip assembly includes a conductive adhesive for mounting to at least one of the circuit patterns.

16. The surface-mount LED according to claim 1, wherein the recess is substantially circular in cross-sectional shape.

17. The surface-mount LED according to claim 2, wherein the recess is substantially circular in cross-sectional shape.

18. The surface-mount LED according to claim 5, wherein the wavelength converting material is a fluorescent substance.

19. The surface-mount LED according to claim 1, wherein the open area is located between the LED chip assembly and the insulator.

20. The surface-mount LED according to claim 19, wherein the open area includes the sealant resin, and the sealant resin extends continuously from the bottom portion of the recess to the LED chip assembly.

21. A surface-mount LED, comprising:
an insulator having a surface and a recess, the recess having a bottom portion and a circumferential portion formed adjacent the bottom portion;
a plurality of separate circuit patterns adjacent the surface of the insulator;
an LED chip assembly located adjacent the bottom portion of the recess provided in the insulator; and
a sealant resin located adjacent the LED for sealing, wherein
at least one of the plurality of separate circuit patterns discontinues under the LED chip assembly to create an open area, and the sealant resin is located both above the LED chip and under the LED chip in the open area.

* * * * *

UNITED STATES PATENT AND TRADEMARK OFFICE
CERTIFICATE OF CORRECTION

| | | |
|---|---|---|
| PATENT NO. | : 7,508,129 B2 | Page 1 of 1 |
| APPLICATION NO. | : 11/275352 | |
| DATED | : March 24, 2009 | |
| INVENTOR(S) | : Seishi Watanabe et al. | |

It is certified that error appears in the above-identified patent and that said Letters Patent is hereby corrected as shown below:

Col. 6-7, Claim 2 should be replaced as follows:

2. A surface-mount LED, comprising:
    an insulator having a surface and a recess, the recess having a bottom portion and a circumferential portion formed adjacent the bottom portion;
    a plurality of separate circuit patterns adjacent the surface of the insulator;
    an LED chip assembly located adjacent the bottom portion of the recess provided in the insulator; and
    a sealant resin located adjacent the LED for sealing,
    wherein at least one of the circuit patterns discontinues to provide an open area located at least partially between the LED chip assembly and the bottom portion of the recess of the insulator, and at least one of the circuit patterns discontinues to provide another open area at the circumferential portion of the recess.

Signed and Sealed this

Sixth Day of April, 2010

David J. Kappos
*Director of the United States Patent and Trademark Office*